(12) United States Patent
Yasukawa

(10) Patent No.: US 10,777,614 B2
(45) Date of Patent: Sep. 15, 2020

(54) DISPLAY DEVICE

(71) Applicant: Japan Display Inc., Tokyo (JP)

(72) Inventor: Koji Yasukawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/283,907

(22) Filed: Feb. 25, 2019

(65) Prior Publication Data

US 2019/0280056 A1  Sep. 12, 2019

(30) Foreign Application Priority Data

Mar. 7, 2018  (JP) .................................. 2018-040957

(51) Int. Cl.
*H01L 27/32* (2006.01)
*H01L 51/50* (2006.01)
*H01L 51/52* (2006.01)

(52) U.S. Cl.
CPC ...... *H01L 27/3211* (2013.01); *H01L 51/5004* (2013.01); *H01L 51/5072* (2013.01); *H01L 51/5096* (2013.01); *H01L 51/5265* (2013.01); *H01L 27/3244* (2013.01); *H01L 27/3248* (2013.01); *H01L 27/3265* (2013.01); *H01L 51/5056* (2013.01); *H01L 2251/552* (2013.01); *H01L 2251/558* (2013.01)

(58) Field of Classification Search
CPC ............. H01L 27/3211; H01L 27/3216; H01L 27/3218; H01L 51/5072; H01L 51/5096; H01L 2251/558
See application file for complete search history.

(56) References Cited

U.S. PATENT DOCUMENTS

| 8,338,222 | B2 * | 12/2012 | Kim ..................... H01L 27/3211 257/40 |
| 2003/0044639 | A1 | 3/2003 | Fukuda |
| 2007/0077594 | A1 * | 4/2007 | Hikmet .................. B82Y 10/00 435/7.1 |
| 2009/0191427 | A1 * | 7/2009 | Liao ..................... H01L 51/5096 428/690 |
| 2009/0273276 | A1 * | 11/2009 | Maeda ................. H01L 51/5012 313/504 |

FOREIGN PATENT DOCUMENTS

JP        2000-323277 A      11/2000

* cited by examiner

*Primary Examiner* — David C Spalla
(74) *Attorney, Agent, or Firm* — Michael Best & Friedrich LLP

(57) ABSTRACT

Provided is a display device having first to third light-emitting elements. The first to third light-emitting elements each include: a first electrode; a hole-transporting layer over the first electrode; an emission layer over the hole-transporting layer; a hole-blocking layer over and in contact with the emission layer; an electron-transporting layer over and in contact with the hole-blocking layer; and a second electrode over the electron-transporting layer. An emission wavelength of the second light-emitting element is longer than that of the first light-emitting element and shorter than that of the third light-emitting element. A total thickness of the hole-blocking layer and the electron-transporting layer in the second light-emitting element is larger than that in the first light-emitting element and smaller than that in the third light-emitting element. A thickness of the hole-blocking layer is larger than that of the electron-transporting layer in each of the first to third light-emitting elements.

18 Claims, 10 Drawing Sheets

DISPLAY DEVICE

CROSS REFERENCE TO RELATED APPLICATIONS

This application is based on and claims the benefit of priority from the prior Japanese Patent Application No. 2018-040957, filed on Mar. 7, 2018, the entire contents of which are incorporated herein by reference.

FIELD

An embodiment of the present invention relates to a display device having a light-emitting element.

BACKGROUND

An organic EL (Electroluminescence) display device is represented as an example of a display device. An organic EL display device has a plurality of organic light-emitting elements (hereinafter, referred to as a light-emitting element) formed over a substrate, and each light-emitting element possesses an electroluminescence layer (hereinafter, referred to as an EL layer) including an organic compound between a pair of electrodes (cathode and anode) as a fundamental structure. Holes and electrons are respectively supplied to the EL layer from the anode and the cathode when a potential difference is provided between the pair of electrodes. The holes and electrons are recombined, resulting in an excited state of the organic compound. Light emission in radiative deactivation of the excited state to a ground state is utilized to realize a function as a light-emitting element.

Efficiency and emission color of a light-emitting element are controlled by the structure of the EL layer and an emission material included in the EL layer. For example, it is possible to obtain a variety of emission colors by appropriately selection of an emission material. In addition, the use of light-interference effect in or outside a light-emitting element increases emission intensity in a front direction and narrows an emission spectrum. For example, it is disclosed in Japanese Patent Application Publication No. 2000-323277 that a thickness of a hole-transporting layer included in an EL layer is adjusted in every light-emitting element, which controls a resonance structure formed by the EL layer and the pair of electrodes. By this method, emission intensity and emission color can be optimized in every light-emitting element.

SUMMARY

An embodiment of the present invention is a display device. The display device possesses first to third light-emitting elements. The first to third light-emitting elements each include: a first electrode; a hole-transporting layer over the first electrode; an emission layer over the hole-transporting layer; a hole-blocking layer over and in contact with the emission layer; an electron-transporting layer over and in contact with the hole-blocking layer; and a second electrode over the electron-transporting layer. An emission wavelength of the second light-emitting element is longer than an emission wavelength of the first light-emitting element and shorter than an emission wavelength of the third light-emitting element. A total thickness of the hole-blocking layer and the electron-transporting layer in the second light-emitting element is larger than a total thickness of the hole-blocking layer and the electron-transporting layer in the first light-emitting element and smaller than a total thickness of the hole-blocking layer and the electron-transporting layer in the third light-emitting element. A thickness of the hole-blocking layer is larger than a thickness of the electron-transporting layer in each of the first to third light-emitting elements.

An embodiment of the present invention is a display device. The display device possesses: first to third pixel electrodes; first to third hole-transporting layers over the first to third pixel electrodes, respectively; first to third emission layers over the first to third hole-transporting layers, respectively; first to third hole-blocking layers over the first to third emission layers, respectively; first to third electron-transporting layers over the first to third hole-blocking layers, respectively; and an opposing electrode of the first to third electron-transporting layers. An emission wavelength over the second emission layer is longer than an emission wavelength of the first emission layer and shorter than an emission wavelength of the third emission layer. A total thickness of the second hole-blocking layer and the second electron-transporting layer is larger than a total thickness of the first hole-blocking layer and the first electron-transporting layer and smaller than a total thickness of the third hole-blocking layer and the third electron-transporting layer. Thicknesses of the first to third hole-blocking layers are respectively larger than thicknesses of the first to third electron-transporting layers.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where a certain structure is arranged immediately above the "other structure" so as to be in contact with the "other structure" and a case where a certain structure is arranged over the "other structure" with an additional structure therebetween.

In the specification and the scope of the claims, an expression that "a structural member is exposed from another structural member" means a mode where a part of the structural member is not covered by the other structural member and includes a mode where the portion of the structural member which is not covered by the other structural member is further covered by another structural member.

First Embodiment

In the present embodiment, a structure of a display device 100 according to an embodiment of the present invention and a structure of a light-emitting element 120 included in the display device 100 are explained.

1. Outline Structure

Figure 1:
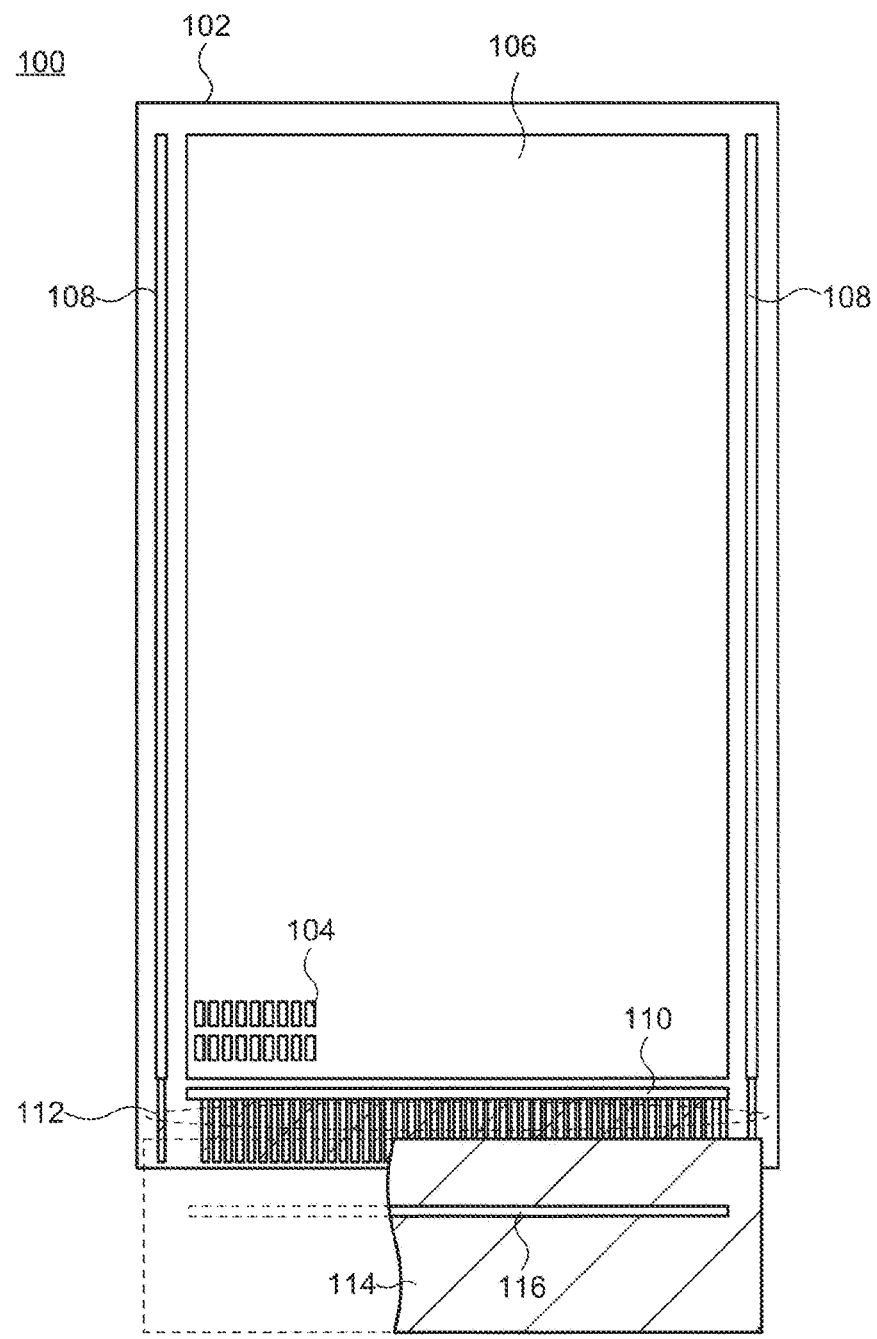
FIG. 1 is a schematic top view of a display device according to an embodiment of the present invention.

A schematic top view of the display device 100 is illustrated in FIG. 1. The display device 100 possesses a substrate 102 and a variety of patterned insulating films, semiconductor films, and conductive films thereover. A plurality of pixels 104 and driver circuits (scanning-line driver circuits 108 and signal-line driver circuit 110) for driving the pixels 104 are prepared with these insulating films, semiconductor films, and conductive films. A display region 106 is defined by the plurality of pixels 104. As described below, the light-emitting element 120 is arranged in each pixel 104.

The scanning-line driver circuits 108 and the signal-line driver circuit 110 are arranged outside the display region 106 (a peripheral region or a frame region). A variety of wirings 112 formed with the patterned conductive films extends to a side of the substrate 102 from the display region 106, the scanning-line driver circuits 108, and the signal-line driver circuit 110 and is exposed at a vicinity of an edge portion of the substrate 102 to form terminals (not illustrated). These terminals are electrically connected to a flexible printed circuit substrate (FPC) 114. In the example shown here, a driver IC 116 having an integrated circuit fabricated over a semiconductor substrate is further mounted over the FPC 114. Image signals and a power source are supplied from an external circuit (not illustrated) through the driver IC 116 and the FPC 114 and further provided to the display region 106, the scanning-line driver circuits 108, and the signal-line driver circuit 110 through the wirings 112. The configuration of the driver circuits and the driver IC 116 is not limited to that demonstrated in FIG. 1; the driver IC 116 may be mounted over the substrate 102, and a function of the signal-line driver circuit 110 may be integrated in the driver circuit 116, for example.

2. Structure of Light-Emitting Element

A plurality of light-emitting elements 120 giving different emission colors is formed in the display device 100, and any one of the light-emitting elements 120 is arranged in every pixel 104. For example, one of the light-emitting elements 120 giving blue emission, green emission, and red emission is arranged in one pixel 104. It is possible to perform full-color display by controlling the plurality of light-emitting elements 120 giving three primary colors. There is no limitation to the emission colors of the light-emitting elements 120, and a light-emitting element giving white emission may be further provided.

Figure 2:
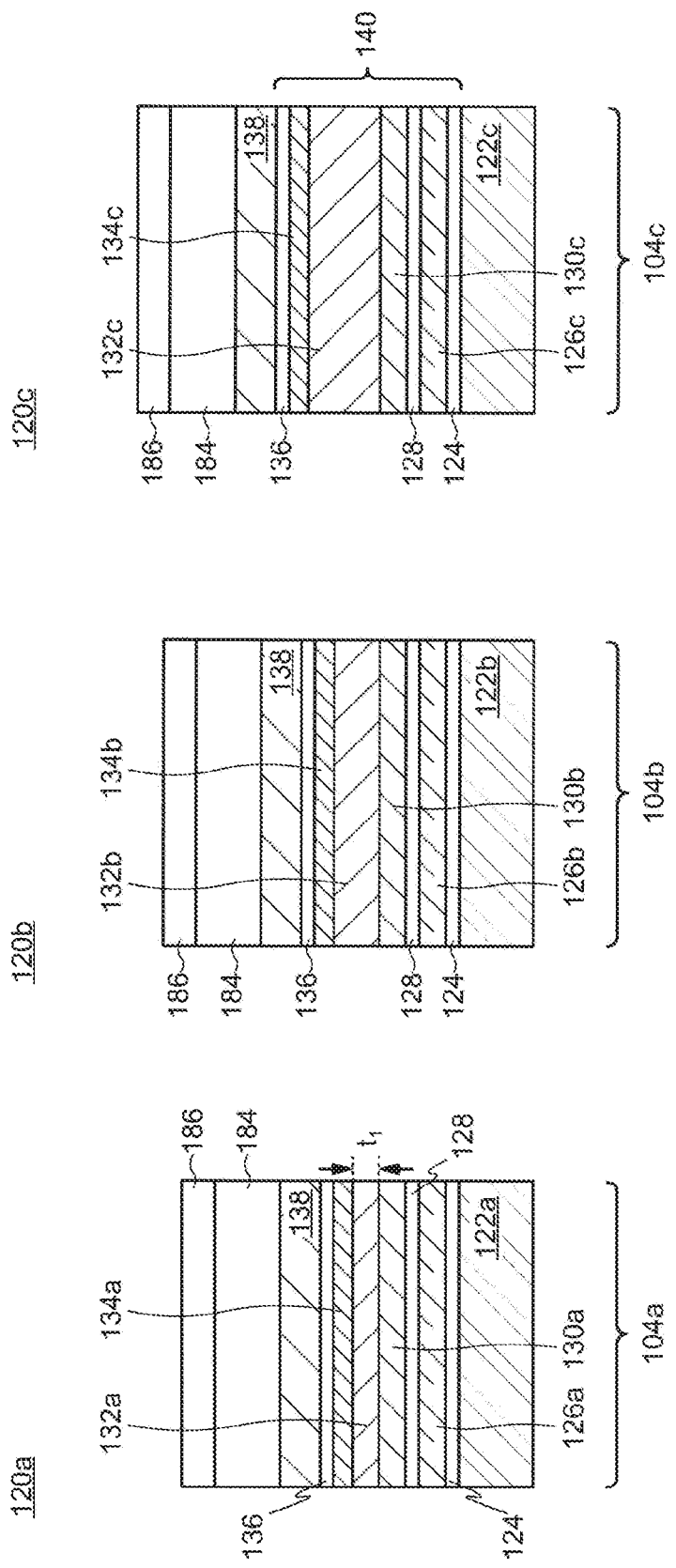
FIG. 2 is a schematic cross-sectional view of display elements of a display device according to an embodiment of the present invention.

FIG. 2 schematically shows cross-sectional structures of a first light-emitting element 120a, a second light-emitting element 120b, and a third light-emitting element 120c respectively arranged in three pixels (a first pixel 104a, a second pixel 104b, and a third pixel 104c) and giving different emission colors from one another. In the example shown here, an emission wavelength of the second light-emitting element 120b is longer than that of the first light-emitting element 120a and shorter than that of the third light-emitting element 120c. For example, the light-emitting elements 120 may be configured so that the first light-emitting element 120a, the second light-emitting element 120b, and the third light-emitting element 120c respectively provide blue emission, green emission, and red emission. In this specification, the blue emission means light emission having an emission peak wavelength in a region equal to or more than 400 nm and less than 500 nm, the green emission means light emission having an emission peak wavelength in a region equal to or more than 500 nm and less than 600 nm, and the red emission means light emission having an emission peak wavelength in a region equal to or more than 600 nm and equal to or less than 780 nm.

Each light-emitting element 120 has a pixel electrode (first electrode) 122. Here, the pixel electrodes 122 of the first light-emitting element 120a, the second light-emitting element 120b, and the third light-emitting element 120c are respectively referred to as a first pixel electrode 122a, a second pixel electrode 122b, and a third pixel electrode 122c for convenience. The pixel electrodes 122 are capable of functioning as an anode or a cathode. In the following explanation, a case is explained where the pixel electrodes 122 function as an anode. The pixels 104 are configured so that a potential is individually applied to the first pixel electrode 122a, the second pixel electrode 122b, and the third pixel electrode 122c.

Each light-emitting element 120 possesses an opposing electrode (second electrode) 138 overlapping with the pixel electrode 122. The opposing electrode 138 is also able to function as an anode or a cathode. In the following explanation, a case is explained where the opposing electrode 138 functions as a cathode. As described below, the opposing electrode 138 extends over the first pixel 104a, the second pixel 104b, and the third pixel 104c. That is, the opposing electrode 138 is continuously formed over the first pixel 104a, the second pixel 104b, and the third pixel 104c and shared by the light-emitting elements 120 disposed in the plurality of pixels 104. Therefore, the same potential is applied to the opposing electrode 138 in the plurality of pixels 104. In each light-emitting element, a variety of functional layers is provided between the pixel electrode 122 and the opposing electrode 138, and holes and electrons are respectively injected to the functional layers from the pixel electrode 122 and the opposing electrode 138. Note that in the specification and claims, the entirety of the functional layers sandwiched by the pixel electrode 122 and the opposing electrode 138 is referred to as the EL layer 140.

As the functional layers of the EL layer 140, a first hole-transporting layer 126a, a first emission layer 130a over the first hole-transporting layer 126a, a first hole-blocking layer 132a over and in contact with the first emission layer 130a, and a first electron-transporting layer 134a over and in contact with the first hole-blocking layer 132a are provided in the first pixel 104a. As an optional structure, the first pixel 104a may have a hole-injection layer 124 in contact with the first pixel electrode 122a, an electron-blocking layer 128 sandwiched by the first hole-transporting layer 126a and the first emission layer 130a, and an electron-injection layer 136 over the first electron-transporting layer 134a.

Similarly, a second hole-transporting layer 126b, a second emission layer 130b over the second hole-transporting layer 126b, a second hole-blocking layer 132b over and in contact with the second emission layer 130b, and a second electron-transporting layer 134b over and in contact with the second hole-blocking layer 132b are provided in the second pixel 104b. Similar to the first pixel 104a, the second pixel 104b may have the hole-injection layer 124 in contact with the second pixel electrode 122b, the electron-blocking layer 128 sandwiched by the second hole-transporting layer 126b and the second emission layer 130b, and the electron-injection layer 136 over the second electron-transporting layer 134b as an optional structure.

Similarly, a third hole-transporting layer 126c, a third emission layer 130c over the third hole-transporting layer 126c, a third hole-blocking layer 132c over and in contact with the third emission layer 130c, and a third electron-transporting layer 134c over and in contact with the third hole-blocking layer 132c are provided in the third pixel 104c. Similar to the first pixel 104a and the second pixel 104b, the third pixel 104c may have the hole-injection layer 124 in contact with the third pixel electrode 122c, the electron-blocking layer 128 sandwiched by the third hole-transporting layer 126c and the third emission layer 130c, and the electron-injection layer 136 over the third electron-transporting layer 134c as an optional structure.

Although a detailed explanation is omitted, the first to third hole-transporting layers 126 may be provided as separated films in the respective light-emitting elements 120. Alternatively, the first to third hole-transporting layers 126 may be provided as an integrated single film so as to be shared by the first to third light-emitting elements 120. The hole-injection layer 124, the electron-blocking layer 128, the electron-injection layer 136 are each disposed as a single layer so as to be shared by the first to third light-emitting elements 120.

As an optional structure, an optical adjustment layer including a first cap layer 184 and a second cap layer 186 over the first cap layer 184 may be formed over each of the light-emitting elements 120. The formation of the optical adjustment layer allows the light emitted from the emission layers 130 through the opposing electrode 138 to resonate, by which the spectrum of the emitted light can be narrowed, and intensity of the emitted light in a front direction can be improved. The optical adjustment layer is also arranged so as to be shared by the first to third light-emitting elements 120.

Hereinafter, the pixel electrode 122, the opposing electrode 138, and each functional layer are explained.

2-1. Pixel Electrode

The pixel electrodes 122 are provided to inject holes to the EL layers 140 and are preferred to have a surface with a relatively high work function. A conductive oxide, such as indium-tin mixed oxide (ITO) and indium-zinc mixed oxide (IZO), capable of transmitting visible light is represented as a specific material for the pixel electrodes 122, and silicon may be further included in the oxide. The use of such a material enables the light emission obtained from the emission layers 130 to be extracted through the pixel electrodes 122. In contrast, when the light emission obtained from the emission layers 130 is extracted through the opposing electrode 138, the pixel electrodes 122 may further include a film containing a metal, such as silver and aluminum, having a high reflectivity with respect to visible light. For example, the pixel electrodes 122 may each have a structure in which a first conductive film containing a conductive oxide, a second conductive film containing a metal such as silver and aluminum, and a third conductive film containing a conductive oxide are stacked in this order. In this case, a top surface of the second conductive film serves as a reflective surface, and the light from the emission layers 130 is reflected at this reflective surface.

2-2. Hole-Injection Layer

A compound to which holes can be readily injected from the pixel electrodes 122, that is, a compound readily oxidized (electron-donating compound), can be used for the hole-injection layer 124. In other words, it is possible to use a compound with a shallow level of a highest occupied molecular orbital (HOMO). For example, an aromatic amine such as a benzidine derivative and a triarylamine, a carbazole derivative, a thiophene derivative, a phthalocyanine derivative such as copper phthalocyanine, and the like can be used. Alternatively, a polythiophene or polyaniline derivative exemplified by poly(2,3-ethylenedioxythiophene)/poly(styrenesulfonic acid) may be used. Alternatively, a mixture of an electron-donating compound such as the aforementioned aromatic amine or carbazole derivative or an aromatic hydrocarbon with an electron acceptor may be used. As an electron acceptor, a transition-metal oxide such as vanadium oxide and molybdenum oxide, a nitrogen-containing heteroaromatic compound, a heteroaromatic compound such as hexaazatriphenylene having a strong electron-withdrawing group, and the like are represented. These compounds and mixtures contribute to reduction of the driving voltage of the display device 100 because of their low ionization potential.

2-3. Hole-Transporting Layer

The hole-transporting layers 126 have a function to transport the holes injected to the hole-injection layer 124 to the side of the emission layers 130. A material the same as or similar to the material usable in the hole-injection layer 124 can be used for the hole-transporting layers 126. For example, it is possible to use a material having a HOMO level deeper than the hole-injection layer 124 by approximately 0.5 eV or less or 0.3 eV or less. The materials described above are able to efficiently transport holes to the side of the emission layers 130 due to a hole mobility higher than an electron mobility, which allows the display device 100 to be operated at a low voltage.

2-4. Electron-Blocking Layer

The electron-blocking layer 128 has a function to confine the electrons injected from the opposing electrode 138 to the emission layers 130 by preventing the electrons from being injected to the hole-transporting layers 126 through the emission layers 130 without contributing to recombination as well as a function to prevent energy transfer of the excited energy obtained in the emission layers 130 to the molecule in the hole-transporting layers 126. With this mechanism, a decrease in emission efficiency can be prevented.

In the electron-blocking layer 128, it is preferred to use a material having a hole mobility higher than or close to an electron mobility, having a level of a lowest unoccupied molecular orbital (LUMO) shallower than the molecules in the emission layers 130, and having a large band gap. Specifically, a difference in LUMO level between the molecule included in the electron-blocking layer 128 and the molecules included in the emission layers 130 is preferably equal to or more than 0.2 eV, equal to or more than 0.3 eV, or equal to or more than 0.5 eV. In addition, a difference in band gap between the molecule included in the electron-blocking layer 128 and the molecules included in the emission layers 130 is preferably equal to or more than 0.2 eV, equal to or more than 0.3 eV, or equal to or more than 0.5 eV. When an emission material is a phosphorescence material, it is preferred to use a material having a triplet level (T1 level) higher than that of the emission material by 0.2 eV or more, 0.3 eV or more, or 0.5 eV or more. More specifically, an aromatic amine derivative, a carbazole derivative, a 9,10-dihydroacrydine derivative, a benzofuran derivative, a benzothiophene derivative, and the like are represented.

2-5. Emission Layer

The emission layers 130 are each a layer supplying a space for recombination of holes and electrons, and the light emission is obtained from the emission materials included in these layers. The emission layers 130 may be each formed with a single compound or may have the so-called host-guest type structure. In the case of the host-guest type, a stillbene derivative, a condensed aromatic compound such as an anthracene derivative, a carbazole derivative, a metal complex including a quinolinol ligand, an aromatic amine, a nitrogen-containing heteroaromatic compound such as a phenanthroline derivative, and the like can be used as a host material, for example. The guest material functions as the emission material, and a fluorescence material such as a coumarin derivative, a pyran derivative, a quinacridone derivative, a tetracene derivative, a pyrene derivative, and an anthracene derivative as well as a phosphorescence material such as an iridium-based orthometal complex or a platinum complex of a porphyrin derivative can be used as a guest material. When the emission layers 130 are each composed of a single compound, the host materials described above can be used. In this case, the host materials function as an emission material.

In the display device 100 of the present embodiment, the materials in the emission layers 130 are selected so that the emission wavelength of the second light-emitting element 120b is longer than the emission wavelength of the first light-emitting element 120a and shorter than the emission wavelength of the third light-emitting element 120c. For example, the emission materials are selected so that the emission material in the first emission layer 130a provides an emission peak in a range equal to or more than 400 nm and less than 500 nm, the emission material in the second emission layer 130b provides an emission peak in a range equal to or more than 500 nm and less than 600 nm, and the emission material in the third emission layer 130c provides an emission peak in a range equal to or more than 600 nm and less than 780 nm.

2-6. Hole-Blocking Layer

The hole-blocking layer 132 has a function to confine the holes injected from the pixel electrodes 120 to the emission layers 130 by preventing the holes from being injected to the electron-transporting layer 132 through the emission layers 130 without contributing to recombination as well as a function to prevent energy transfer of the excited energy obtained in the emission layers 130 to the molecule in the electron-transporting layer 134. With this mechanism, a decrease in emission efficiency can be prevented.

In the hole-blocking layer 132, it is preferred to use a material having an electron mobility higher than a hole mobility, having a HOMO level deeper than the molecules in the emission layers 130, and having a large band gap. Specifically, a difference in HOMO level between the molecule included in the hole-blocking layer 132 and the molecules included in the emission layers 130 is preferably equal to or more than 0.2 eV, equal to or more than 0.3 eV, or equal to or more than 0.5 eV. In addition, a difference in band gap between the molecule included in the hole-blocking layer 132 and the molecules included in the emission layers 130 is preferably equal to or more than 0.2 eV, equal to or more than 0.3 eV, or equal to or more than 0.5 eV. When the emission material is a phosphorescence material, it is preferred to use a material having a T1 level higher than that of the emission material by 0.2 eV or more, 0.3 eV or more, or 0.5 eV or more. Specifically, a phenanthroline derivative, an oxadiazole derivative, a triazole derivative, and a metal complex, such as bis(2-methyl-8-qunolato)(4-hydroxybiphenyl) aluminum, having a relatively large band gap (e.g., equal to or larger than 2.8 eV) are represented.

Here, each layer is preferably configured so that a difference in LUMO level between the molecule included in the hole-blocking layer 132 and the molecules including in the emission layers 130 is equal to or more than 0 eV and equal to or more than 0.2 eV. With this configuration, the electrons injected from the opposing electrode 138 can be more smoothly transported to the emission layers 130, and the emission regions in the emission layers 130 can be shifted to a side of the pixel electrodes 122.

In the display device 100, the hole-blocking layers 132 possess a higher mobility than the electron-transporting layers 134 and are composed of a material with an electron mobility equal to or more than $1\times10^{-4}$ cm$^2$/Vs and equal to or less than $1\times10^{-2}$ cm$^2$/Vs, equal to or more than $1\times10^{-4}$ cm$^2$/Vs and equal to or less than $5\times10^{-3}$ cm$^2$/Vs, or equal to or more than $1\times10^{-4}$ cm$^2$/Vs and equal to or less than $1\times10^{-3}$ cm$^2$/Vs. Due to the high electron mobility of the hole-blocking layers 132, the driving voltage does not increase even if the thicknesses ($t_1$) of the hole-blocking layers 132 are increased. In addition, not only can an increase in power consumption of the display device 100 be suppressed, but also the electrons can be more rapidly transported to the emission layers 130. In other words, it is possible to arbitrarily adjust the distances from the emission layers 130 to the opposing electrode 138 by adjusting the thicknesses of the hole-blocking layers 132.

The hole-blocking layers 132 are formed so as to have thicknesses larger than the electron-transporting layers 134 in each light-emitting element 120. In addition, the hole-blocking-layers 132 have different thicknesses between the light-emitting elements 120 with different emission colors. Specifically, the thickness of the first hole-blocking layers 132a in the first light-emitting element 120a giving light emission with the shortest wavelength is smallest and smaller than the thickness of the second hole-blocking layer 132b. On the other hand, the thickness of the third hole-blocking layer 132c in the third light-emitting element 120c giving light emission with the longest wavelength is largest and larger than the thickness of the second hole-blocking layer 132b. For instance, the thicknesses of the first hole-blocking layer 132a and the second hole-blocking layer 132b are each selected from a range from 10 nm to 30 nm and typically 10 nm and 15 nm, respectively. The thickness of the third hole-blocking layer 132c is selected from a range from 25 nm to 40 nm and typically 25 nm or 30 nm.

2-7. Electron-Transporting Layer

The electron-transporting layers 134 have a function to transport the electrons injected from the opposing electrode 138 to the electron-injection layer 136 to the side of the emission layers 130. The electron-transporting layers 134 contain a compound (electron-transporting compound) having an electron-transporting property higher than a hole-transporting property. Specifically, a material is selected so that the electron mobilities of the electron-transporting layers 134 is equal to or higher than $1\times10^{-6}$ cm$^2$/Vs and equal to or lower than $1\times10^{-4}$ cm$^2$/Vs, equal to or higher than $1\times10^{-6}$ cm$^2$/Vs and equal to or lower than $5\times10^{-5}$ cm$^2$/Vs, or equal to or higher than $1\times10^{-6}$ cm$^2$/Vs and equal to or lower than $1\times10^{-5}$ cm$^2$/Vs. Moreover, it is preferred to select a material so that a difference in LUMO level between the electron-transporting layers 134 and the hole-blocking layers 132 is equal to or more than 0 eV and equal to or less than 0.2 eV. As such a material, a metal complex such as an aluminum complex, a lithium complex, and a beryllium complex, an oxadiazole derivative, a triazole derivative, a silacyclopentadiene derivative, a condensed aromatic compound such as an anthracene derivative, a pyrene derivative, and a perylene derivative, a nitrogen-containing condensed heteroaromatic compound such as phenanthroline derivative, and the like are represented. As the metal complex, a metal complex such as 8-qunolinolato lithium (Liq), tris(8-qunolinolato) aluminum (Alq), and bis(8-qunolinolato) beryllium having an 8-quinolinole ligand is exemplified. These compounds may have a substituent, and an alkyl group having 1 to 4 carbon atoms and an aryl group such as a phenyl group and a naphthyl group are represented as a substituent.

The thicknesses of the electron-transporting layers 134 are selected from a range equal to or more than 1 nm and equal to or less than 10 nm or equal to or more than 1 nm and equal to or less than 5 nm. The thicknesses of the electron-transporting layers 134 may be the same between the light-emitting elements 120. As described above, the hole-blocking layer 132 having a higher electron mobility than the electron-transporting layer 134 is prepared at a thickness larger than the electron-transporting layer 134 in each light-emitting element 120. Therefore, the relatively low electron mobilities of the electron-transporting layers 134 are compensated by the high electron mobilities of the hole-blocking layers 132, which enable operation of the display device 100 at a low voltage.

The light-emitting elements 120 may be configured so that a summation of the thicknesses (total thickness) of the second hole-blocking layer 132b and the second electron-transporting layer 134b in the second light-emitting element 120b is larger than a summation of the thicknesses of the first hole-blocking layer 132a and the first electron-transporting layer 134a in the first light-emitting element 120a and smaller than a summation of the thicknesses of the third hole-blocking layer 132c and the third electron-transporting layer 134c in the third light-emitting element 120a. Specifically, the summation of the thicknesses of the first hole-blocking layer 132a and the first electron-transporting layer 134a may be 15 nm to 25 nm and typically 20 nm. The summation of the thicknesses of the second hole-blocking layer 132b and the second electron-transporting layer 134b may be 20 nm to 30 nm and typically 25 nm. The summation of the thicknesses of the third hole-blocking layer 132c and the third electron-transporting layer 134c may be 30 nm to 40 nm and typically 35 nm.

2-8. Electron-Injection Layer

The electron-injection layer 136 has a function to promote electron injection from the opposing electrode 138. As a material usable for the electron-injection layer 136, an inorganic compound such as lithium fluoride and calcium fluoride is represented, for example. Alternatively, a mixture of an electron-transporting compound which can be used for the electron-transporting layers 134 with an electron-donating compound exemplified by a Group 1 metal such as lithium, a Group 2 metal such as magnesium and calcium, and a lanthanide metal such as ytterbium can be used. Typically, a mixture of Alq and Li and a mixture of Liq and Li are represented. A density of electrons as a carrier is high in the mixed layer of an electron-transporting compound and an electron-donating compound because an anion radical of the electron-transporting compound exists therein. Hence, the electron-transporting property of the electron-transporting layers 134 increases, and the electrons injected from the opposing electrode 138 can be efficiently transported to the emission layers 130. Accordingly, the driving voltage of the display device 100 is decreased. A thickness of the electron-injection layer 136 may be selected from a range from 0.5 nm to 10 nm or from 1 nm to 5 nm.

2-9. Opposing Electrode

The opposing electrode 138 has a function to inject electrons to the EL layer 140. Simultaneously, the opposing electrode 138 also functions as a reflective electrode when the light emission from the emission layers 130 is extracted through the pixel electrodes 122 or as a semi-reflective and semi-transparent electrode partly reflecting and partly transmitting the light emission. When the opposing electrode 138 is used as a reflective electrode, a film including a metal such as aluminum, magnesium, silver, or an alloy thereof and having a thickness allowing visible light to be efficiently reflected is used as the opposing electrode 138. On the other hand, when the opposing electrode 138 is used as a semi-reflective and semi-transparent electrode, the opposing electrode 138 is configured to include a conductive oxide, such as ITO and IZO, having a light-transmitting property. Alternatively, a metal film may be used which includes the metals described above and has a thickness which allows visible light to pass therethrough. In this case, a stacked body in which a conductive oxide having a light-transmitting property is further stacked may be used.

2-10. Cap Layer

The first cap layer 184 may include a material having high transmissivity in a visible region and a relatively high refraction index. As an example of such a material, an organic compound is represented. As an organic compound, a polymer material is a typical example, and a polymer material including sulfur, halogen, or phosphorous is exemplified. As a polymer including sulfur, a polymer having a substituent such as a thioether, a sulfone, and a thiophene in a main or side chain is represented. As a polymer material including phosphorous, a polymer material including a phosphorous acid group, a phosphoric acid group, or the like in a main or side chain, and a polyphosphazene and the like are represented. As a polymer material including halogen, a polymer material having bromine, iodine, or chlorine as a substituent is given as an example. The polymers described above may be intermolecularly or intramolecularly cross-linked. An inorganic compound is represented as another example, and titanium oxide, zirconium oxide, chromium oxide, aluminum oxide, indium oxide, ITO, IZO, lead sulfide, zinc sulfide, silicon nitride, and the like are exemplified. A mixture of the inorganic compound and the polymer material may be used.

On the other hand, the second cap layer 186 may include a material having high transmissivity in a visible region and a relatively low refractive index. As an example, a polymer material including fluorine is represented. As a polymer including fluorine, polytetrafluoroethylene, poly(vinylidene fluoride), a derivative thereof as well as a polyimide, a poly(methacrylic ester), a poly(acrylic ester), and a polysiloxane having fluorine in a main or side chain are represented. These polymers may be intermolecularly or intramolecularly crosslinked. As an inorganic material having a low refractive index, a metal fluoride such as lithium fluoride, magnesium fluoride, and calcium fluoride and silicon oxide including boron oxide or phosphorus oxide are represented.

3. Optical Design

In the display device 100, it is possible to increase emission efficiency in a front direction and improve color purity of the light emission by optically designing the EL layers 140 as appropriate. As described above, in the case (top emission) where the light emission from the emission layers 130 is extracted from the opposing electrode 138, the pixel electrodes 120 serve as a reflective electrode, while the opposing electrode 138 partly reflects and partly transmits the light emission from the emission layers 130 as a semi-reflective semi-transparent electrode. On the other hand, in the case (bottom emission) wherein the light-emission from the emission layers 130 is extracted from the pixel electrodes 122, the pixel electrodes 122 transmits visible light, while the opposing electrode 138 functions as a reflective electrode. In this case, the light from the EL layers 140 is partly reflected at the interfaces between the pixel electrodes 122 and the EL layer 140 due to the difference in refractive index between the pixel electrodes 122 and the EL layer 140. Namely, these interfaces function as a reflective surface. Therefore, a micro resonator is formed between the reflection surfaces of the pixel electrodes 122 and the opposing electrode 138, and the light generated in the emission layers 130 interferes with itself in each of the cases of the top emission and the bottom emission. Hereinafter, an explanation is provided on an assumption that the top surfaces of the pixel electrodes 122 and a bottom surface of the opposing electrode 138 shown in FIG. 2 serve as the reflection surfaces thereof and that a micro resonator is formed therebetween.

The interference effect in the micro resonator is determined by an optical distance between the top surface of the pixel electrode 122 and the bottom surface of the opposing electrode 138 and the spectrum of the light emitted from the emission layer 130. The optical distance is a summation of the products of the refractive index by the thickness of the individual functional layers. The light interference occurs to amplify the light emission when the EL layer 140 is adjusted so that the optical distance is consistent with an odd multiple of one fourth of the wavelength of the target emission ($\lambda/4$) in the case of the top emission. In the case of the bottom emission, the light interference occurs to amplify the light emission when the EL layer 140 is adjusted so that the optical distance is consistent with an integral multiple of a half of the wavelength of the target emission ($\lambda/4$). Such an adjustment increases the emission intensity of the emission layer 130 in a front direction and narrows the emission spectrum.

In the display device 100, the optical distance of the EL layer 140 can be readily adjusted by controlling the thickness of the hole-blocking layer 132 in each light-emitting element 120. For instance, the optical adjustment is carried out by controlling the thickness of the first hole-blocking layer 132a in the first light-emitting element 120a. The optical distance of the second light-emitting element 120b is longer than that of the first light-emitting element 120a because the second emission layer 130b provides the light emission on the long-wavelength side compared with the first emission layer 130a. Hence, the optical adjustment is carried out by preparing the second hole-blocking layer 132b at a thickness larger than that of the first hole-blocking layer 132a to satisfy the interference requirements described above. Similarly, the optical distance of the third light-emitting element 120c is longer than that of the second light-emitting element 120b because the third emission layer 130c provides the light emission on the long-wavelength side compared with the second emission layer 130b. Therefore, in the third light-emitting element 120c, the optical adjustment is performed by arranging the third hole-blocking layer 132c having a larger thickness than the second hole-blocking layer 132b so as to satisfy the requirements for interference described above.

As described above, the hole-blocking layers 132 have a high electron-transporting property. Therefore, it is possible to prevent an increase in driving voltage even if the thick hole-blocking layers 132 are formed to perform the optical adjustment. In addition, the high electron-transporting property permits the emission region to be shifted to the side of the pixel electrode 122 in each light-emitting layer 130, which significantly contributes to an increase in emission efficiency particularly in the first light-emitting element 120a having the shortest emission wavelength. A reason for the increase in emission efficiency is as follows. In the first light-emitting element 120a providing the light emission with the shortest wavelength, the use of a fluorescence material as an emission material realizes excellent color purity and high reliability. When a fluorescence material is used as an emission material, recombination of an electron and a hole generates a singlet excited state S1 and a triplet excited state (T1) at probabilities of approximately 25% and 75%, respectively. The singlet excited state is immediately deactivated radiatively to the ground state to provide emission, while the triplet excited state of a fluorescence material does not contribute to emission because the triplet excited state is deactivated to the ground state via a non-radiative deactivation process.

However, the single excited state can be generated through the reaction between the triplet excited states, that is, a triplet-triplet annihilation (T-T annihilation), by shifting the emission region to the side of the pixel electrodes 122 to increase exciton density. Hence, not only the singlet excited state directly formed by the recombination but also the singlet excited state generated through the T-T annihilation process contributes to the light emission. As a result, the first light-emitting element 120a is capable of emitting light at an external quantum efficiency over 20%.

4. Modified Example

Figure 3:
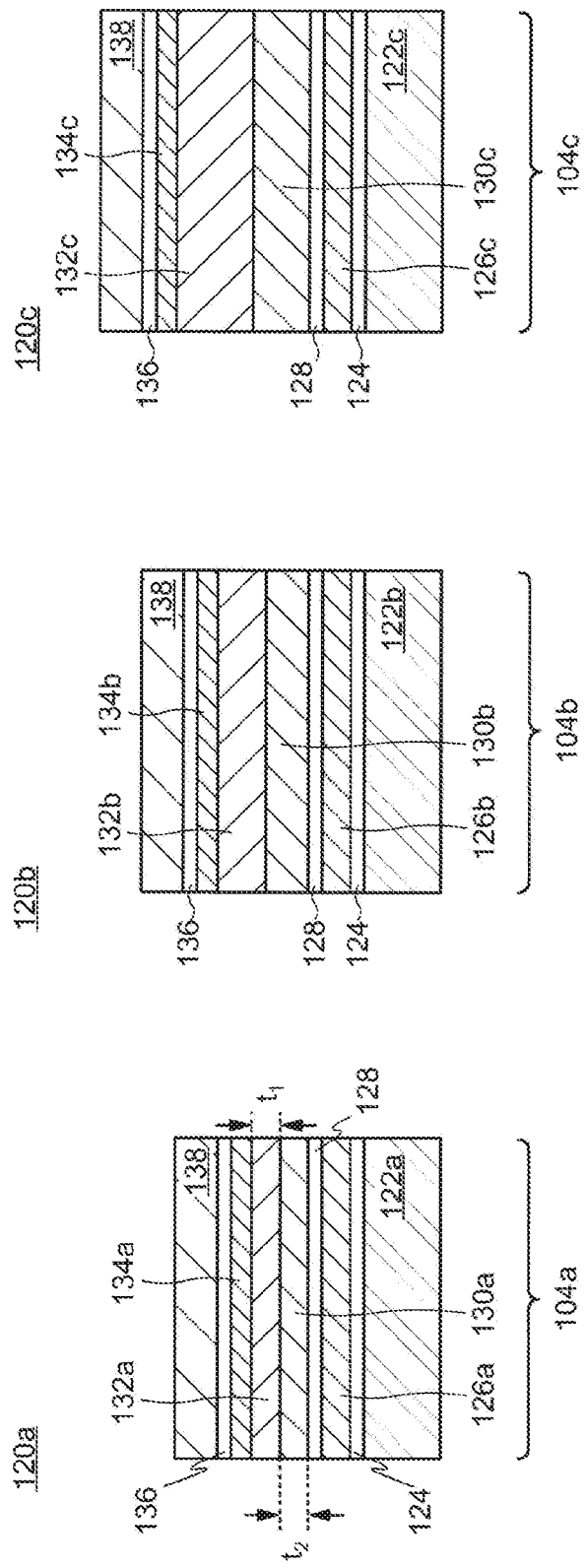
FIG. 3 is a schematic cross-sectional view of display elements of a display device according to an embodiment of the present invention.

The display device 100 may be configured so that the thicknesses ($t_2$) of the emission layers 130 in addition to the thicknesses of the hole-blocking layers 132 are different between the light-emitting elements 120. Specifically, the display device 100 may be configured so that the thickness of the second emission layer 130b is larger than the thickness of the emission layer 130a and equal to or smaller than the thickness of the third emission layer 130c as shown in FIG. 3. The use of this structure enables the optical adjustment to be performed with both of the hole-blocking layers 132 and the emission layers 130.

Figure 4:
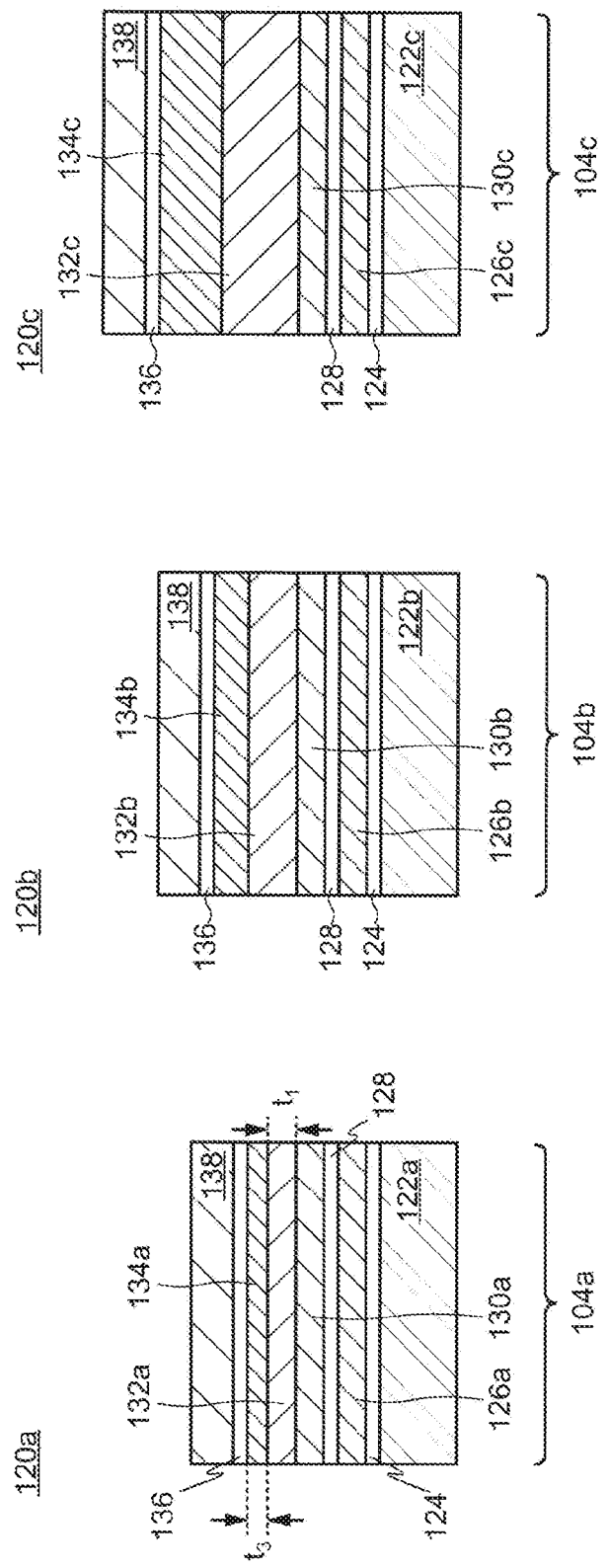
FIG. 4 is a schematic cross-sectional view of display elements of a display device according to an embodiment of the present invention.

Alternatively, the display device 100 may be configured so that the thicknesses ($t_3$) of the electron-transporting layers 134 in addition to the thicknesses of the hole-blocking layers 132 are different between the light-emitting elements 120 as shown in FIG. 4. Specifically, the display device 100 may be configured so that the thickness of the second electron-transporting layer 134b is larger than the thickness of the first electron-transporting layer 134a and smaller than the thickness of the third electron-transporting layer 134c. The use of this structure enables the optical adjustment to be performed with both of the hole-blocking layers 132 and the electron-transporting layers 134.

Figure 5:
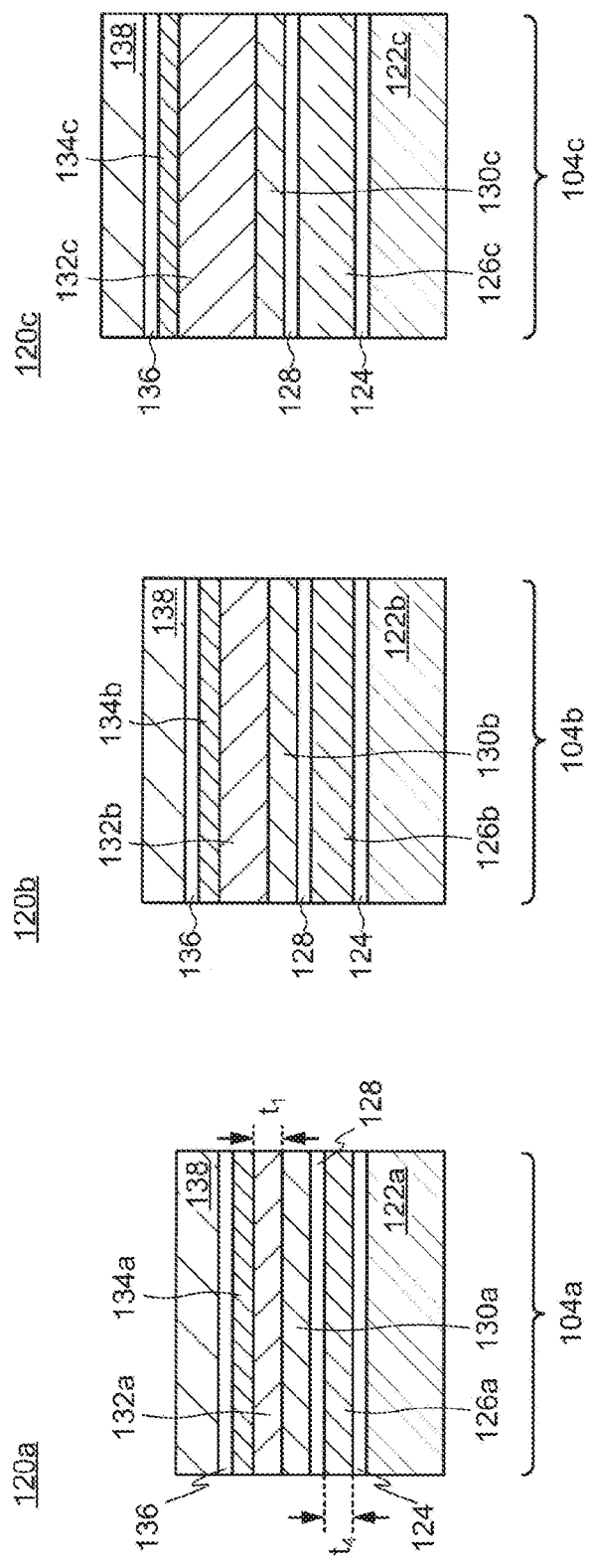
FIG. 5 is a schematic cross-sectional view of display elements of a display device according to an embodiment of the present invention.

Alternatively, the display device 100 may be configured so that the thicknesses ($t_4$) of the hole-transporting layers 126 in addition to the thicknesses of the hole-blocking layers 132 are different between the light-emitting elements 120 as shown in FIG. 5. Specifically, the display device 100 may be configured so that the thickness of the second hole-transporting layer 126b is larger than the thickness of the first hole-transporting layer 126a and smaller than the thickness of the third hole-transporting layer 126c of the third light-emitting element 120c. The use of this structure enables the optical adjustment to be performed with both of the hole-blocking layers 132 and the hole-transporting layers 126.

Figure 6:
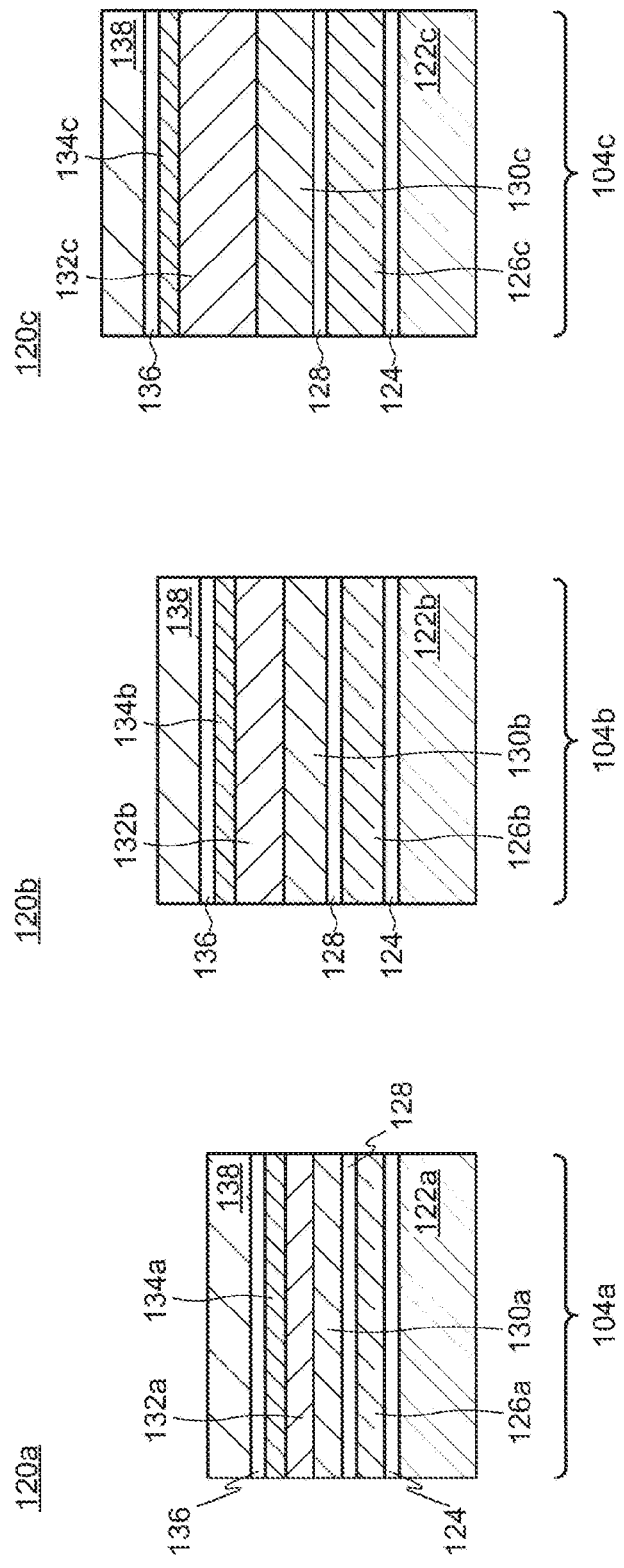
FIG. 6 is a schematic cross-sectional view of display elements of a display device according to an embodiment of the present invention.

Alternatively, the display device 100 may be configured so that the thicknesses of the electron-transporting layers 134 and the hole-transporting layers 126 in addition to the thicknesses of the hole-blocking layers 132 are different between the light-emitting elements 120 as shown in FIG. 6. In this case, the relationship between the thicknesses of the hole-blocking layers 132, the electron-transporting layers 134, and the hole-transporting layers 126 is the same as that of the light-emitting elements 120 shown in FIG. 3, FIG. 4, and FIG. 5.

In conventional light-emitting elements, optical adjustment is carried out using a hole-transporting layer and a hole-injection layer located under an emission layer. In contrast, optical adjustment is conducted in each light-emitting element 120 mainly using the hole-blocking layer 132 in the display device 100. As demonstrated in the Examples, the inventor found that the light-emitting element 120 exhibiting higher efficiency and reliability than the conventional light-emitting elements can be provided with this method. Moreover, it was confirmed that an increase in driving voltage can be suppressed due to the high electron-transporting property of the hole-blocking layers 132 even if the optical adjustment is conducted by using the hole-blocking layers 132. Accordingly, implementation of the present embodiment enables production of a display device with low power consumption as well as excellent color reproducibility and reliability.

5. Structure of Pixel

5-1. Pixel Circuit

A pixel circuit including the light-emitting element 120 is fabricated in each pixel 104 with a variety of patterned insulating films, semiconductor films, and conductive films. A structure of the pixel circuit may be arbitrarily selected, and an example is illustrated in FIG. 7 as an equivalent circuit.

Figure 7:
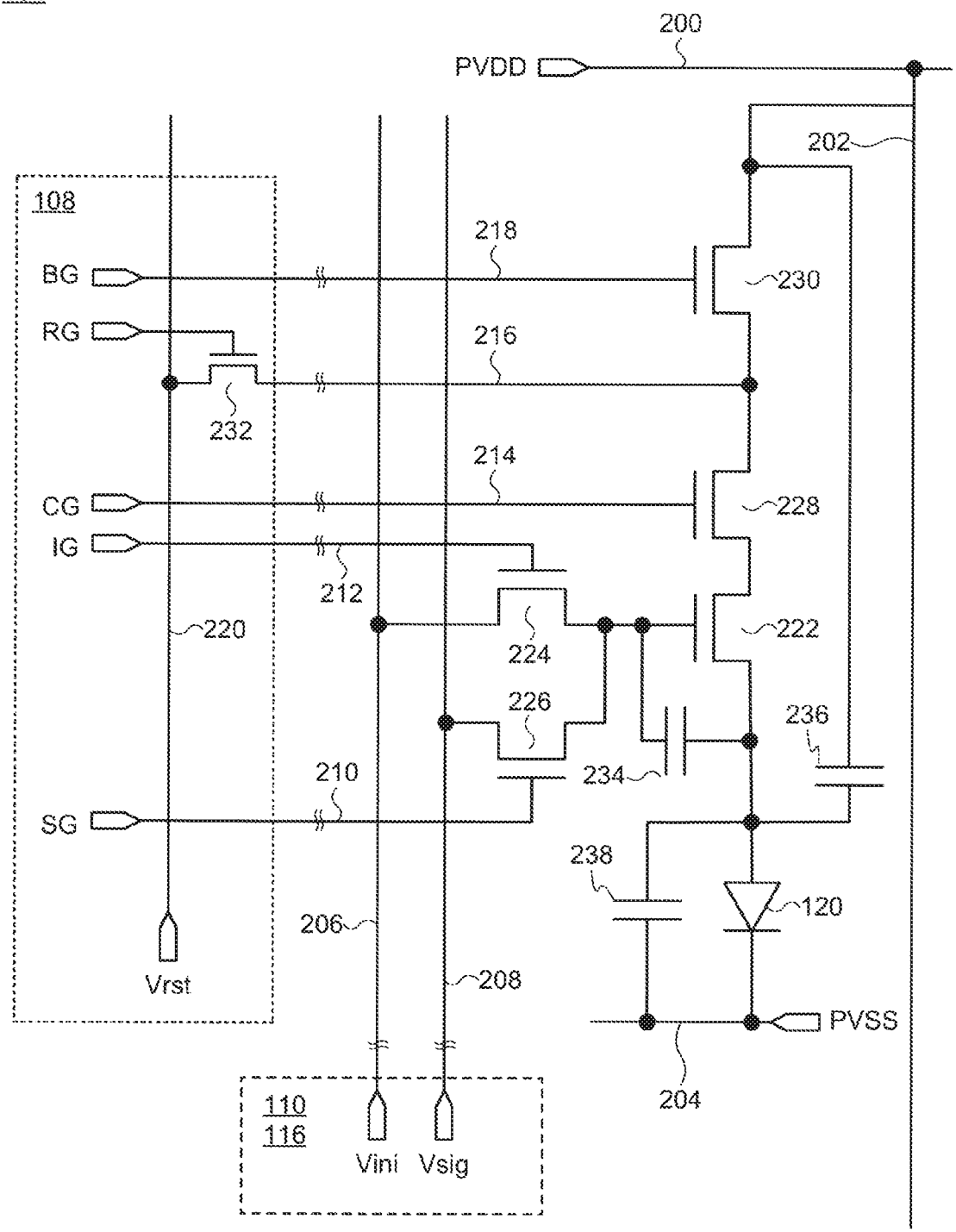
FIG. 7 is an example of an equivalent circuit of a pixel of a display device according to an embodiment of the present invention.

The pixel circuit shown in FIG. 7 possesses a driving transistor 222, an emission-controlling transistor 230, a compensating transistor 228, an initialization transistor 224, a writing transistor 226, a storage capacitor 234, and a supplementary capacitor 236 in addition to the light-emitting element 120. A capacitor 238 is not an independent capacitor element but parasitic capacitance of the light-emitting element 120. A high potential PVDD is provided to a high-potential power-source line 200, and a potential thereof is supplied to the pixels 104 connected to each column through a current-supplying line 202. The light-emitting element 120, the driving transistor 222, the emission-controlling transistor 230, and the compensating transistor 228 are connected in series between the high-potential power-source line 200 and a low-potential power source line 204. The low-potential power source line 204 is provided with a low potential PVSS.

One terminal of the driving transistor 222 is electrically connected to the high-potential power-source line 200 through the emission-controlling transistor 230 and the compensating transistor 228, and the other terminal is electrically connected to the light-emitting element 120. A gate of the driving transistor 222 is electrically connected to a first signal line 206 through the initialization transistor 224 and is also electrically connected to a second signal line 208 through the writing transistor 226. An initialization signal Vini is provided to the first signal line 206, while an image signal Vsig is provided to the second signal line 208. The initialization signal Vini is a signal providing an initialization potential at a constant level. Operation (on/off) of the writing transistor 226 is controlled by a scanning signal SG supplied to a write-controlling scanning line 210 connected to the gate thereof. The gate of the initialization transistor 224 is connected to an initialization-control scanning line 212 provided with an initialization-control signal IG, and operation thereof is controlled with the initialization-control signal IG. When the writing transistor 226 is on and the initialization transistor 224 is off, a potential of the image signal Vsig is provided to the gate of the driving transistor 222. On the other hand, when the writing transistor 226 is off, and the initialization transistor 224 is on, a potential of the initialization signal Vini is provided to the gate of the driving transistor 222.

A compensation-control scanning line 214 applied with a compensation-control signal CG and an emission-control scanning line 218 applied with an emission-control signal BG are respectively connected to the gates of the compensating transistor 228 and the emission-controlling transistor 230. A reset-controlling line 216 is connected to one terminal of the driving transistor 222 through the compensating transistor 228. The reset-controlling line 216 is connected to a reset transistor 232 disposed in the scanning-line driver circuits 108. The reset transistor 232 is controlled with a reset-control signal RG by which a reset potential Vrst supplied to a reset signal line 220 can be applied to one terminal of the driving transistor 222 through the compensating transistor 228.

The storage capacitor 234 is disposed between the other terminal and the gate of the driving transistor 222. One terminal of the supplementary capacitor 236 is connected to the other terminal of the driving transistor 222, and the other terminal of the storage capacitor 234 is connected to the high-potential power-source line 200. The supplementary capacitor 236 may be provided so that the other terminal is connected to the low-potential power-source line 204. The storage capacitor 234 and the supplementary capacitor 236 are formed in order to maintain a gate-source voltage Vgs corresponding to the image signal Vsig when the image signal Vsig is provided to the gate of the driving transistor 222.

The signal-line driver circuit 110 or the driver IC 116 respectively outputs the initialization signal Vini and the image signal Vsig to the first signal line 206 and the second signal line 208. The scanning-line driver circuits 108 respectively output the scanning signal SG, the initialization-control signal IG, the compensation-control signal CG, the emission-control signal BG, and the reset-control signal RG to the write-controlling scanning line 210, the initialization-control scanning line 212, the compensation-control scanning line 214, the emission-control scanning line 218, and a gate of the reset transistor 232.

5-2. Cross-Sectional Structure

Figure 8:
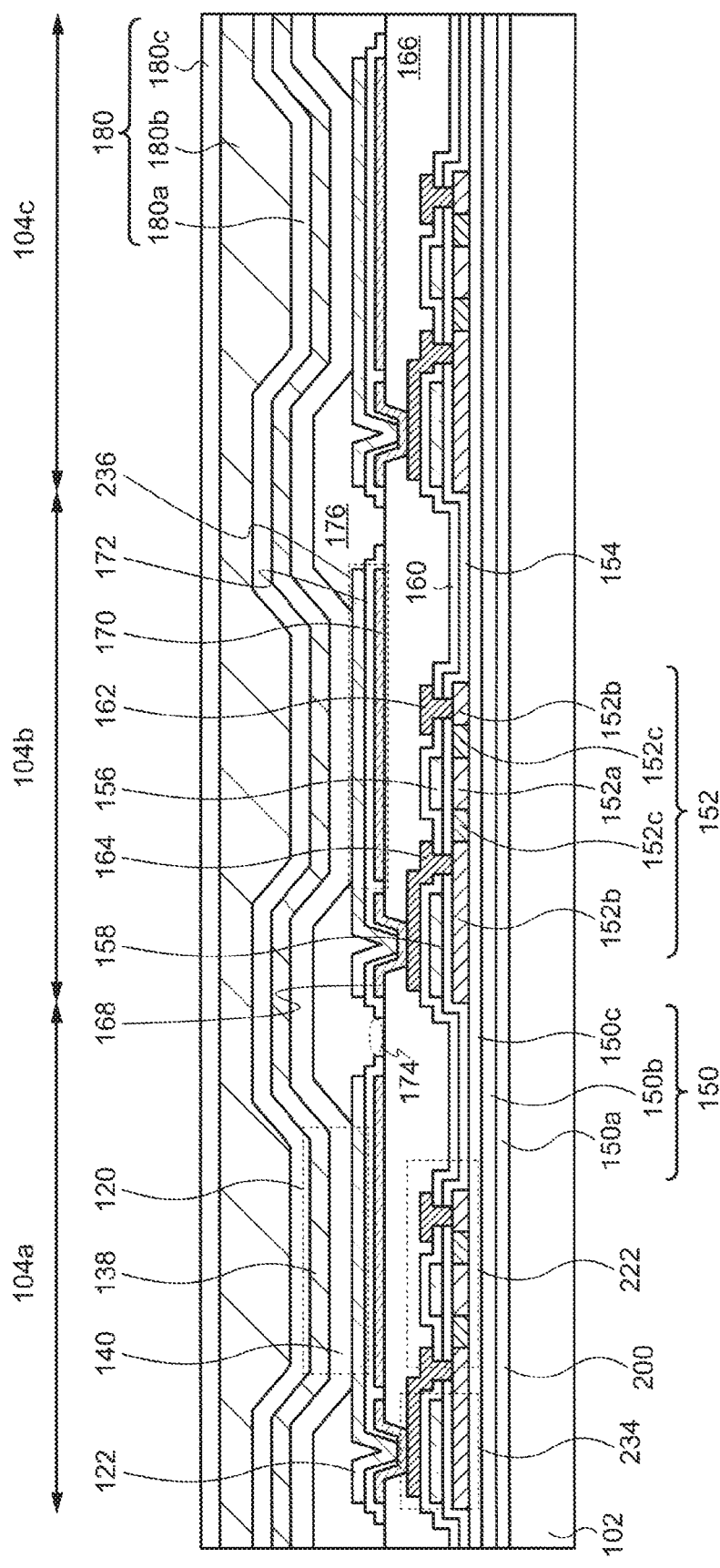
FIG. 8 is a schematic cross-sectional view of a display device according to an embodiment of the present invention.

A schematic cross-sectional view of the display device 100 is shown in FIG. 8. FIG. 8 is a schematic cross-sectional view of adjacent three pixels 104 (the first pixel 104a, the second pixel 104b, and the third pixel 104c) formed over the substrate 102. Here, the cross-sectional structures of the driving transistor 222, the storage capacitor 234, the supplementary capacitor 236, and the light-emitting element 120 included in each pixel 104 are illustrated.

Each element included in the pixel circuit is disposed over the substrate 102 through an undercoat 150. The substrate 102 may contain glass, quartz, or plastics. The use of plastics provides flexibility to the substrate 102. As a plastic, a polymer such as a polyimide, a polyamide, a polyester, and a polycarbonate is represented, and a polyimide having a high thermal resistivity is preferred among them. The undercoat 150 may have a single-layer structure or may be structured with a plurality of films as shown in FIG. 8. In the case of using a plurality of films, a film 150a containing silicon oxide, a film 150b containing silicon nitride, and a film 150c containing silicon oxide may be formed in this order over the substrate 102, for example.

The driving transistor 222 includes a semiconductor film 152, a gate insulating film 154, a gate electrode 156, a drain electrode 162, and a source electrode 164. The gate electrode 156 is arranged so as to intersect at least a part of the semiconductor film 152 through the gate insulating film 154, and a channel region 152a is formed in the region where the gate electrode 156 overlaps with the semiconductor film 152. The semiconductor film 152 further possesses low-concentration impurity regions 152c sandwiching the channel region 152a and high-concentration impurity regions 152b sandwiching the channel region 152a and the low-concentration impurity regions 152c.

A capacitor electrode 158 existing in the same layer as the gate electrode 156 is disposed so as to overlap with the high-concentration impurity region 152b through the gate insulating film 154. An interlayer insulating film 160 is arranged over the gate electrode 156 and the capacitor electrode 158. Openings reaching the high-concentration impurity regions 152b are formed in the interlayer insulating film 160 and the gate insulating film 154, and the drain electrode 162 and the source electrode 164 are arranged so as to cover the openings. A part of the source electrode 164 overlaps with a part of the high-concentration impurity region 152b and the capacitor electrode 158 through the interlayer insulating film 160, and the storage capacitor 234 is configured by a part of the high-concentration impurity region 152b, the gate insulating film 154, the capacitor electrode 158, the interlayer insulating film 160, and a part of the source electrode 164.

A leveling film 166 is further provided over the driving transistor 222 and the storage capacitor 234. The leveling film 166 has an opening reaching the source electrode 164, and a connection electrode 168 covering this opening and a part of a top surface of the leveling film 166 is formed so as to be in contact with the source electrode 164. A supplementary capacitor electrode 170 is further disposed over leveling film 166. A capacitor insulating film 172 is arranged so as to cover the connection electrode 168 and the supplementary capacitor electrode 170. The capacitor insulating film 172 does not cover a part of the connection electrode 168 in the opening of the leveling film 166 and exposes a top surface of the connection electrode 168, by which electrical connection between the pixel electrode 122 formed thereover and the source electrode 164 is realized. An opening 174 may be formed in the capacitor insulating film 172 in order to allow contact between the leveling film 166 and a partition wall 176 formed thereover. Impurities in the leveling film 166 can be removed through the opening 174, by which reliability of the light-emitting element 120 can be improved. Note that the formation of the connection electrode 168 and the opening 174 is optional.

The pixel electrode 122 overlapping with the connection electrode 168 and the supplementary capacitor electrode 170 is fabricated over the capacitor insulating film 172. The capacitor insulating film 172 is sandwiched by the supplementary capacitor electrode 170 and the pixel electrode 122, and the supplementary capacitor 236 is formed with this structure. The pixel electrode 122 is shared by the supplementary capacitor 236 and the light-emitting element 120.

The partition wall 176 is provided over the pixel electrode 122 to cover the edge portion of the pixel electrode 122. The EL layer 140 and the opposing electrode 138 thereover are provided so as to cover the pixel electrode 122 and the partition wall 176. The structure described above can be applied to the EL layer 140, and each functional layer structuring the EL layer 140 and the opposing electrode 138 are formed by appropriately applying an ink-jet method, a spin-coating method, a printing method, an evaporation method, or a sputtering method. In FIG. 8, the detailed structure of the EL layer 140 is not illustrated for visibility.

The display device 100 may include, as an optional structure, a passivation film 180 to protect the light-emitting elements 120. The structure of the passivation film 180 may be also arbitrarily determined, and a single-layer structure or a stacked-layer structure may be employed. In the case of a stacked-layer structure, a structure may be employed where a first layer 180a including a silicon-containing inorganic compound, a second layer 180b including a resin, and a third layer 180c including a silicon-containing inorganic compound are stacked in this order as shown in FIG. 8. As a silicon-containing inorganic compound, silicon nitride and silicon oxide are represented. As a resin, an epoxy resin, an acrylic resin, a polyester, a polycarbonate, and the like are exemplified.

Figure 9:
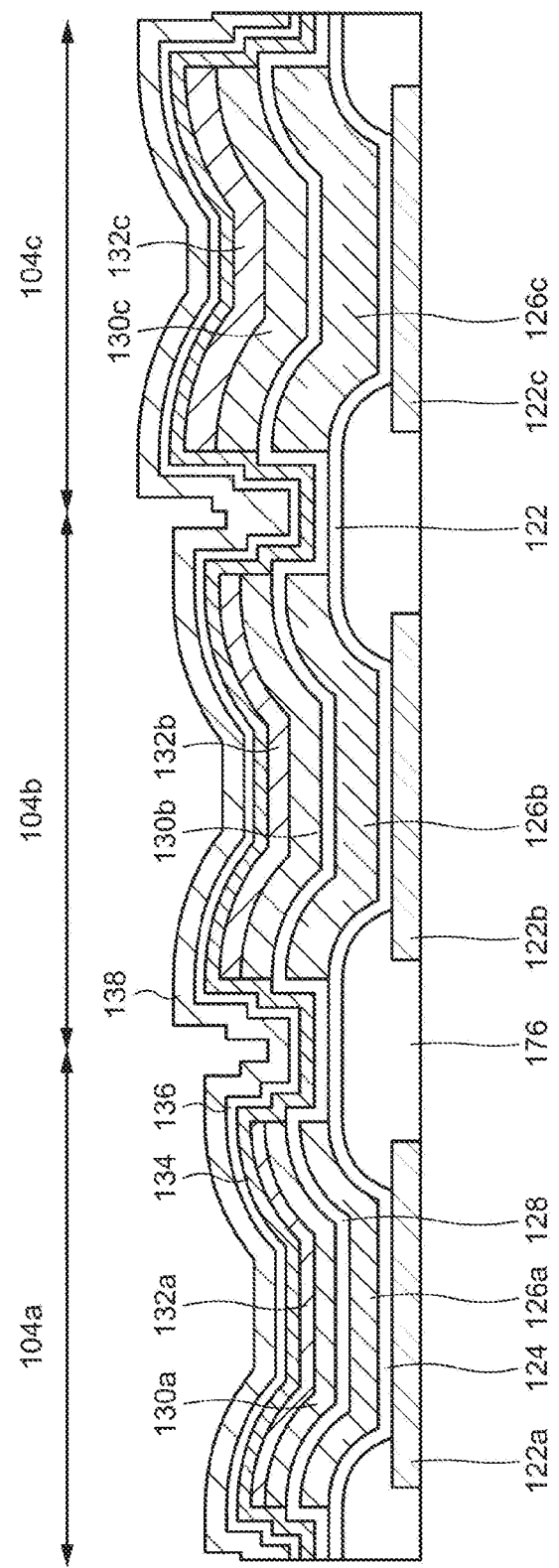
FIG. 9 is a schematic cross-sectional view of a display device according to an embodiment of the present invention.

A schematic cross-sectional view of the light-emitting element 120 shown in FIG. 8 is illustrated in FIG. 9. In FIG. 9, an example is demonstrated where the first light-emitting element 120a, the second light-emitting element 120b, and the third light-emitting element 120c shown in FIG. 6 are respectively arranged in the first pixel 104a, the second pixel 104b, the third pixel 104c. That is, an example is demonstrated where the thicknesses of the hole-blocking layers 132, the hole-transporting layers 126, and the emission layers 130 are different between the light-emitting elements 120. As shown in FIG. 9, the hole-injection layer 124, the electron-blocking layer 128, the electron-transporting layer 134, the electron-injection layer 136, and the opposing electrode 138 are continuously disposed across the plurality of pixels 104. Namely, these layers and the electrode are shared by the plurality of light-emitting elements 120. Therefore, the electron-transporting layer 134 is a single film in which the first electron-transporting layer 134a, the second electron-transporting layer 134b, and the third electron-transporting layer 134c shown in FIG. 6 are integrated. On the other hand, the hole-transporting layers 126, the emission layers 130, and the hole-blocking layers 132 are provided so as to be spaced between the adjacent pixels 104.

Figure 10:
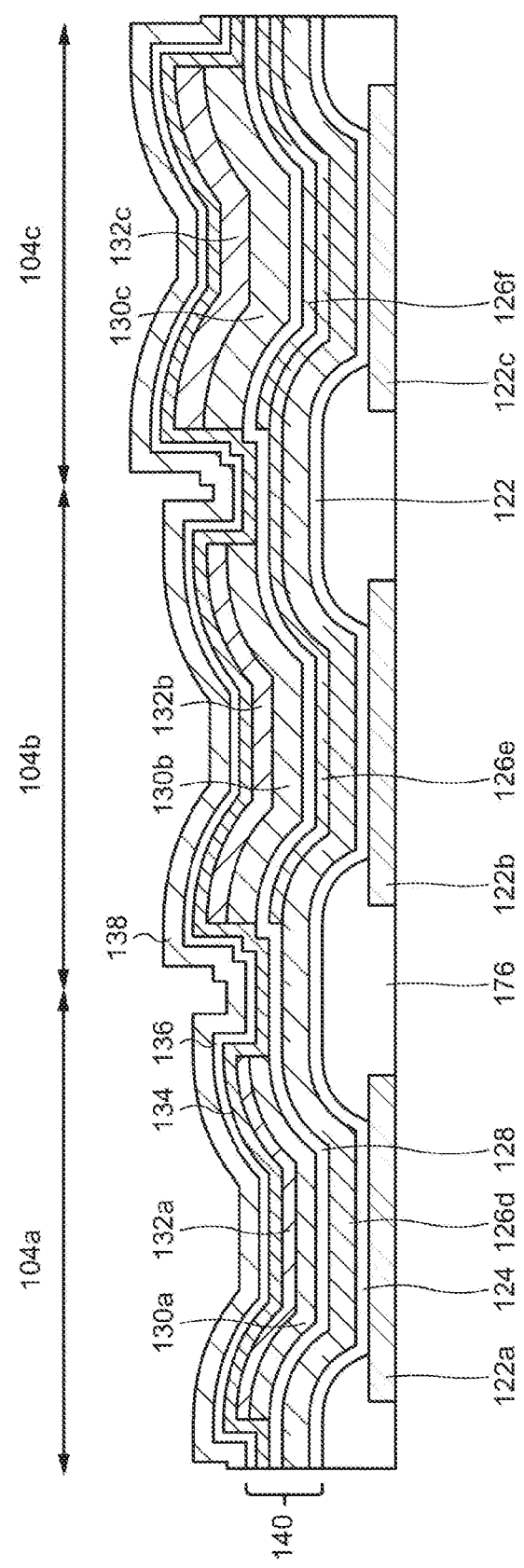
FIG. 10 is a schematic cross-sectional view of a display device according to an embodiment of the present invention.

Although the hole-transporting layers 126 are disposed so as to be spaced between the adjacent pixels 104 in the example shown in FIG. 9, the hole-transporting layers 126 may also be prepared as a film in which the first hole-transporting layer 126a, the second hole-transporting layer 126b, and the third hole-transporting layer 126c are integrated so as to be shared by the plurality of pixels 104 as shown in FIG. 10. In this case, a hole-transporting layer 126d may be formed over the first pixel electrode 112a, the second pixel electrode 112b, and the third pixel electrode 112c so as to extend over the first light-emitting element 120a to the third light-emitting element 120c, a hole-transporting layer 126e is selectively formed over the second pixel electrode 112b and the third pixel electrode 112c, and then a hole-transporting layer 126f may be selectively formed over the third pixel electrode 122c. In this case, the hole-transporting layer 126d corresponds to the first hole-transporting layer 126a in the first light-emitting element 120a, and the stack of the hole-transporting layer 126d and the hole-transporting layer 126e corresponds to the second hole-transporting layer 126b in the second light-emitting element 120b. Similarly, the stack of the hole-transporting layer 126d and the hole-transporting layer 126f corresponds to the third hole-transporting layer 126c in the third light-emitting element 120c.

In these modified examples, the hole-blocking layers 132 exhibiting a high electron-transporting property are prepared at a thickness larger than that of the electron-transporting layer 134, and the optical adjustment is conducted with the hole-blocking layers 132. Furthermore, the thicknesses of the hole-blocking layers 132 are different between the light-emitting elements 120 providing different emission colors. Hence, it is possible to perform the optical adjustment in each light-emitting element 120 without an increase in driving voltage, and the light-emitting element 120 with excellent color purity and high emission efficiency as well as the display device 100 including the same can be provided.

Example 1

In the present Example, evaluation results of the properties of the light-emitting elements 120 disposed in the display device 100 are described.

The display device 100 in the Example 1 possesses the first light-emitting element 120a to the third light-emitting element 120c shown in FIG. 6. The thicknesses of the hole-transporting layers 126, the hole-blocking layers 132, and the electron-transporting layers 134 of these light-emitting elements are summarized in Table 1. The thicknesses of the emission layers 130 of the first light-emitting element 120a to the third light-emitting element 120c were respectively 15 nm, 45 nm, and 40 nm, and the opposing electrode 138 (20 nm thickness) was prepared by co-evaporating silver and magnesium. A display device (Comparative Example 1) including three light-emitting elements (fourth to sixth light-emitting elements) having a conventional element structure was also fabricated as a reference. The materials used in the functional layers of the first light-emitting element 120a to the third light-emitting element 120c of the Example 1 are respectively the same as the materials used in the functional layers of the fourth to sixth light-emitting elements. The thicknesses of the hole-transporting layers 126, the hole-blocking layers 132, and the electron-transporting layers 134 of the fourth to sixth light-emitting elements of the Comparative Example 1 are also shown in Table 1. As can be understood from Table 1, the thicknesses of the hole-blocking layers 132 are smaller than the thicknesses of the electron-transporting layers 134 and the same between the light-emitting elements in the Comparative Example. The optical adjustment was carried out by using the hole-transporting layers 126, the hole-blocking layers 132, and the electron-transporting layers 134 in each light-emitting element of Example 1 and Comparative Example 1.

TABLE 1

Thicknesses of the principal functional layers of the light-emitting elements of the Example and Comparable Example

|  |  | Hole-transporting layer (nm) | Hole-blocking layer (nm) | Electron-transporting layer (nm) |
| --- | --- | --- | --- | --- |
| Example 1 | First light-emitting element | 140 | 10 | 10 |
|  | Second light-emitting element | 150 | 15 | 10 |
|  | Third light-emitting element | 200 | 25 | 10 |
| Comparable example 1 | Fourth light-emitting element | 135 | 10 | 15 |
|  | Fifth light-emitting element | 150 | 10 | 15 |
|  | Sixth light-emitting element | 210 | 10 | 15 |

The properties of the light-emitting elements of Example 1 and Comparative Example 1 are summarized in Table 2.

TABLE 2

Properties of the light-emitting elements[a]

|  |  | Driving voltage (V) | Current efficiency (cd/A) | Color coordinates x | Color coordinates y | LT95[b] (h) |
|---|---|---|---|---|---|---|
| Example 1 | First light-emitting element | 3.4 | 6.9 | 0.134 | 0.056 | 400 |
|  | Second light-emitting element | 3.5 | 111 | 0.299 | 0.682 | 400 |
|  | Third light-emitting element | 3.7 | 51 | 0.675 | 0.324 | 800 |
| Comparable example 1 | Fourth light-emitting element | 3.6 | 6.2 | 0.133 | 0.061 | 600 |
|  | Fifth light-emitting element | 3.5 | 102 | 0.299 | 0.682 | 400 |
|  | Sixth light-emitting element | 3.3 | 44 | 0.677 | 0.322 | 600 |

[a]At a current density of 15 mA/cm$^2$.
[b]Time for 5% decrease in luminance.

As shown in FIG. 2, it was confirmed that all of the light-emitting elements 120 of the Example 1 provide blue, green, or red emission with excellent color purity. Although no significant difference in a driving voltage was observed between the elements of Example 1 and Comparative Example 1, a remarkable increase in current efficiency measured in a front direction was observed in Example 1. There was no large difference in time for a 5% decrease in luminance showing reliability between Example 1 and Comparative Example 1. However, in view of the increase in current efficiency, these results mean that reliability (time for a 5% decrease in luminance) does not change even if the light-emitting elements emit light at a higher luminance. Thus, it can be concluded that reliability of the light-emitting elements 120 of Example 1 are practically increased.

Example 2

In the present Example, evaluation results of the properties of the display device 100 (Example 2) including the light-emitting elements 120 having different thicknesses of the hole-transporting layers 126, the hole-blocking layers 132, and the electron-transporting layers 134 from those of the light-emitting elements 120 of Example 1 are described.

Similar to Example 1, the display device 100 of Example 2 has the first light-emitting element 120a to the third light-emitting element 120c shown in FIG. 6, and the thicknesses of the hole-transporting layers 126, the hole-blocking layers 132, and the electron-transporting layers 134 of these light-emitting elements 120 are summarized in Table 3. The thicknesses of the emission layers 130 of the first light-emitting element 120a to the third light-emitting element 120c were respectively 15 nm, 45 nm, and 40 nm, and the opposing electrode 130 (20 nm thickness) was prepared by co-evaporating silver and magnesium. A display device (Comparative Example 2) having three light-emitting elements (seventh to ninth light-emitting elements) having a conventional element structure was also fabricated as a reference. The materials used in the functional layers of the first light-emitting element 120a to the third light-emitting element 120c were respectively the same as the materials used in the functional layers of the seventh to ninth light-emitting elements. The thicknesses of the hole-transporting layers 126, the hole-blocking layers 132, and the electron-transporting layers 134 of the seventh to ninth light-emitting elements are also summarized in Table 3. As can be understood from Table 3, the thicknesses of the hole-blocking layers 132 are smaller than the thicknesses of the electron-transporting layers 134 in the light-emitting elements of Comparative Example 2 and are different between the light-emitting elements. On the other hand, the hole-blocking layers 132 are thinner than the electron-transporting layers 134 and the same between the light-emitting elements in the light-emitting elements of Comparative Example 1. Similar to Example 1 and Comparative Example 1, the optical adjustment was conducted by using the hole-transporting layers 126, the hole-blocking layers 132, and the electron-transporting layers 134 in each of the light-emitting elements of the Example 2 and the Comparative Example 2.

TABLE 3

Thicknesses of the principal functional layers of the light-emitting elements of the Example and Comparable Example

|  |  | Hole-transporting layer (nm) | Hole-blocking layer (nm) | Electron-transporting layer (nm) |
|---|---|---|---|---|
| Example 2 | First light-emitting element | 140 | 10 | 10 |
|  | Second light-emitting element | 150 | 15 | 10 |
|  | Third light-emitting element | 200 | 25 | 10 |
| Comparable example 2 | Seventh light-emitting element | 135 | 10 | 15 |
|  | Eighth light-emitting element | 150 | 10 | 15 |
|  | Ninth light-emitting element | 210 | 10 | 15 |

The properties of the light-emitting elements of the Example 2 and the Comparative Example 2 are summarized in Table 4.

TABLE 4

Properties of the light-emitting elements[a]

|  |  | Driving voltage (V) | Current efficiency (cd/A) | Color coordinates x | Color coordinates y | LT95[b] (h) |
|---|---|---|---|---|---|---|
| Example 2 | First light-emitting element | 3.1 | 7.3 | 0.134 | 0.056 | 500 |
|  | Second light-emitting element | 3.9 | 109 | 0.298 | 0.683 | 500 |
|  | Third light-emitting element | 3.9 | 49 | 0.675 | 0.324 | 1000 |
| Comparable example 2 | Seventh light-emitting element | 3.4 | 6.2 | 0.133 | 0.061 | 200 |
|  | Eighth light-emitting element | 3.3 | 101 | 0.300 | 0.681 | 300 |
|  | Ninth light-emitting element | 3.3 | 45 | 0.677 | 0.322 | 400 |

[a]At a current density of 15 mA/cm$^2$.
[b]Time for 5% decrease in luminance.

As shown in FIG. 4, it was revealed that all of the light-emitting elements 120 of the Example 2 provide blue, green, or red emission with excellent color purity. Although the driving voltage of the light-emitting elements 120 of Example 2 slightly increased compared with that of Comparative Example 2, no significant difference was observed. However, a remarkable increase in current efficiency measured in a front direction and reliability was observed in each of the first light-emitting element 120a to the third light-emitting element 120c.

As described above, it was confirmed that implementation of the embodiment of the present invention enables production of a highly reliable light-emitting element with excellent color purity and emission efficiency. Therefore, it is possible to provide a display device with excellent color reproducibility and low power consumption by utilizing these light-emitting elements.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
   first, second, and third light-emitting elements each comprising:
   a first electrode;
   a hole-transporting layer over the first electrode;
   an emission layer over the hole-transporting layer;
   a hole-blocking layer over and in contact with the emission layer;
   an electron-transporting layer over and in contact with the hole-blocking layer; and
   a second electrode over the electron-transporting layer,
   wherein an emission wavelength of the second light-emitting element is longer than an emission wavelength of the first light-emitting element and shorter than an emission wavelength of the third light-emitting element,
   a total thickness of the hole-blocking layer and the electron-transporting layer in the second light-emitting element is larger than a total thickness of the hole-blocking layer and the electron-transporting layer in the first light-emitting element and smaller than a total thickness of the hole-blocking layer and the electron-transporting layer in the third light-emitting element,
   a thickness of the hole-blocking layer is larger than a thickness of the electron-transporting layer in each of the first to third light-emitting elements, and
   a thickness of the hole-transporting layer in the second light-emitting element is larger than a thickness of the hole-transporting layer in the first light-emitting element and smaller than a thickness of the hole-transporting layer in the third light-emitting element.

2. The display device according to claim 1, wherein the thickness of the hole-blocking layer in the second light-emitting element is larger than the thickness of the hole-blocking layer in the first light-emitting element and smaller than the thickness of the hole-blocking layer in the third light-emitting element.

3. The display device according to claim 1, wherein thicknesses of the electron-transporting layers in the first to third light-emitting elements are each equal to or more than 1 nm and equal to or less than 10 nm.

4. The display device according to claim 1, wherein thicknesses of the electron-transporting layers in the first to third light-emitting elements are the same as one another.

5. The display device according to claim 1, wherein electron mobilities of the hole-blocking layers in the first to third light-emitting elements are each equal to or more than $1 \times 10^{-4}$ cm$^2$/Vs, and
   electron mobilities of the electron-transporting layers in the first to third light-emitting elements are each equal to or more than $1 \times 10^{-6}$ cm$^2$/Vs.

6. The display device according to claim 1, wherein, in each of the first to third light-emitting element, a difference in LUMO level between the hole-blocking layer and the electron-transporting layer and a difference in LUMO level between the hole-blocking layer and the emission layer are each equal to or less than 0.2 eV.

7. The display device according to claim 1, wherein each of the first electrodes in the first light-emitting element, the second light-emitting element, and the third light-emitting element comprises a reflective surface reflecting visible light, and
   an optical distance between the reflective surface and a bottom surface of the second electrode is substantially the same as an odd multiple of one fourth of the emission wavelength in each of the first to third light-emitting elements.

8. The display device according to claim 1,
wherein the thickness of the hole-blocking layer in the third light-emitting element is equal to or more than 25 nm.

9. A display device comprising:
first, second, and third pixel electrodes;
first, second, and third hole-transporting layers over the first to third pixel electrodes, respectively;
first, second, and third emission layers over the first to third hole-transporting layers, respectively;
first, second, and third hole-blocking layers over the first to third emission layers, respectively;
first, second, and third electron-transporting layers over the first to third hole-blocking layers, respectively; and
an opposing electrode over the first to third electron-transporting layers,
wherein an emission wavelength of the second emission layer is longer than an emission wavelength of the first emission layer and shorter than an emission wavelength of the third emission layer,
a total thickness of the second hole-blocking layer and the second electron-transporting layer is larger than a total thickness of the first hole-blocking layer and the first electron-transporting layer and smaller than a total thickness of the third hole-blocking layer and the third electron-transporting layer,
thicknesses of the first to third hole-blocking layers are respectively larger than thicknesses of the first to third electron-transporting layers, and
a thickness of the second hole-transporting layer is larger than a thickness of the first hole-transporting layer and smaller than a thickness of the third hole-transporting layer.

10. The display device according to claim 9,
wherein the first to third electron-transporting layers are integrated as a single film.

11. The display device according to claim 9,
wherein the first to third hole-transporting layers are integrated as a single film.

12. The display device according to claim 9,
wherein the thickness of the second hole-blocking layer is larger than the thickness of the first hole-blocking layer and smaller than the thickness of the third hole-blocking layer.

13. The display device according to claim 9,
wherein thicknesses of the first to third electron-transporting layers are each equal to or more than 1 nm and equal to or less than 10 nm.

14. The display device according to claim 9,
wherein thicknesses of the first to third electron-transporting layers are substantially the same as one another.

15. The display device according to claim 9,
wherein electron mobilities of the first to third hole-blocking layers are each equal to or more than $1\times10^{-4}$ cm$^2$/Vs, and
electron mobilities of the first to third electron-transporting layers are each equal to or more than $1\times10^{-6}$ cm$^2$/Vs.

16. The display device according to claim 9,
wherein a difference in LUMO level between the first hole-blocking layer and the first electron-transporting layer and a difference in LUMO level between the first hole-blocking layer and the first emission layer are each equal to or less than 0.2 eV,
a difference in LUMO level between the second hole-blocking layer and the second electron-transporting layer and a difference in LUMO level between the second hole-blocking layer and the second emission layer are each equal to or less than 0.2 eV, and
a difference in LUMO level between the third hole-blocking layer and the third electron-transporting layer and a difference in LUMO level between the third hole-blocking layer and the third emission layer are each equal to or less than 0.2 eV.

17. The display device according to claim 9,
wherein the first to third pixel electrodes each comprise a reflective surface reflecting visible light, and
an optical distance between the reflective surface of the first pixel electrode and a bottom surface of the opposing electrode, an optical distance between the reflective surface of the second pixel electrode and the bottom surface of the opposing electrode, and an optical distance between the reflective surface of the third pixel electrode and the bottom surface of the opposing electrode are substantially the same as odd multiples of one fourth of the emission wavelengths of the first emission layer, the second emission layer, and the third emission layer, respectively.

18. The display device according to claim 9,
wherein the thickness of the third hole-blocking layer is equal to or more than 25 nm.

* * * * *